(12) United States Patent
Aoyama

(10) Patent No.: US 12,486,899 B2
(45) Date of Patent: Dec. 2, 2025

(54) SEAL COVER

(71) Applicant: SUMITOMO WIRING SYSTEMS, LTD., Mie (JP)

(72) Inventor: Naoki Aoyama, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 80 days.

(21) Appl. No.: 18/692,778

(22) PCT Filed: Sep. 6, 2022

(86) PCT No.: PCT/JP2022/033419
§ 371 (c)(1),
(2) Date: Mar. 15, 2024

(87) PCT Pub. No.: WO2023/047942
PCT Pub. Date: Mar. 30, 2023

(65) Prior Publication Data
US 2024/0384793 A1     Nov. 21, 2024

(30) Foreign Application Priority Data

Sep. 27, 2021    (JP) ................................ 2021-156491

(51) Int. Cl.
     *F16J 15/06*         (2006.01)
(52) U.S. Cl.
     CPC .................... *F16J 15/06* (2013.01)

(58) Field of Classification Search
CPC ...................................................... F16J 15/06
See application file for complete search history.

(56) References Cited

U.S. PATENT DOCUMENTS

| | | | |
|---|---|---|---|
| 10,158,192 B1* | 12/2018 | Yokotani | H01R 13/5845 |
| 10,218,110 B2* | 2/2019 | Wakimoto | H01R 13/512 |
| 2011/0053403 A1* | 3/2011 | Tsuruta | H01R 13/4365 |
| | | | 439/345 |
| 2011/0100704 A1* | 5/2011 | Iida | H05K 5/0069 |
| | | | 174/520 |
| 2012/0285718 A1* | 11/2012 | Sakakura | H01R 13/6315 |
| | | | 174/50.5 |
| 2020/0251850 A1* | 8/2020 | Wakimoto | H01R 13/707 |

* cited by examiner

*Primary Examiner* — Vishal A Patel
(74) *Attorney, Agent, or Firm* — Venjuris, P.C.

(57) ABSTRACT

A first screw is inserted into a first through hole of a shield cover, and is attached to a first seal member, and a second screw is inserted into a second through hole of the shield cover, and is attached to a second seal member. The first through hole has a first clearance therein, and the second through hole has a second clearance therein. The first seal member is movable relative to the shield cover along one plane in accordance with the first clearance, the one plane being a plane that intersects a fitting direction. The second seal member is movable relative to the shield cover along the one plane in accordance with the second clearance. The first screw is attached at a position displaced from a center of the first seal member to one side in an alignment direction of the first seal member.

6 Claims, 11 Drawing Sheets

SEAL COVER

CROSS REFERENCE TO RELATED APPLICATIONS

This application is a national phase of PCT application No. PCT/JP2022/033419, filed on 6 Sep. 2022, which claims priority from Japanese patent application No. 2021-156491, filed on 27 Sep. 2021, all of which are incorporated herein by reference.

TECHNICAL FIELD

The present disclosure relates to a seal cover.

BACKGROUND

Patent Document 1 describes a seal cover that covers an opening portion of an attachment target such as a case. The seal cover of Patent Document 1 includes a seal member (described as a "fitting" in Patent Document 1) that includes a portion to be fitted into the opening portion of the attachment target, and a shield case to which the seal member is attached, and that is fixed to the attachment target.

PRIOR ART DOCUMENT

Patent Document
Patent Document 1: JP 2017-091809 A

SUMMARY OF THE INVENTION

Problems to be Solved

In the seal cover in Patent Document 1, the seal member is attached to the shield case at the center of the seal member. For this reason, an operator who performs an operation of attaching the seal member to the shield cover needs to be careful not to perform the attachment operation in a state where the seal member is rotated by 180 degrees from the proper attachment orientation.

In view of this, an object of the present disclosure is to provide a technique that can improve ease of an operation of attaching a seal member to a shield cover.

Means to Solve the Problem

A seal cover according to the present disclosure is a seal cover that is to be attached to an attachment target including a first opening portion and a second opening portion that is aligned with the first opening portion and is smaller than the first opening portion, and covers the first opening portion and the second opening portion, and includes: a first seal member that includes a first seal portion that is fitted into the first opening portion to seal the first opening portion, a second seal member that includes a second seal portion that is fitted into the second opening portion to seal the second opening portion, and is aligned with the first seal member, a shield cover that is attached to the first seal member and the second seal member, is to be fixed to the attachment target, and includes a first through hole and a second through hole, an interlock connector that is attached to the first seal member, and ensures attachment of the seal cover to the attachment target, a first screw that is inserted into the first through hole of the shield cover and is attached to the first seal member, and a second screw that is inserted into the second through hole of the shield cover and is attached to the second seal member, the first through hole having a first clearance therein, the second through hole having a second clearance therein, the attachment target including a partner connector that is to be mated with the interlock connector, the first seal member being movable relative to the shield cover along one plane in accordance with the first clearance, the one plane being a plane that intersects a fitting direction in which the interlock connector is mated with the partner connector, the second seal member being movable relative to the shield cover along the one plane in accordance with the second clearance independently from the first seal member, the interlock connector being attached at a position closer to a center of the first seal member than the first screw is in an alignment direction of the first seal member and the second seal member, the first screw being attached at a position displaced from the center of the first seal member to one side in the alignment direction, and the second screw being attached at a center of the second seal member.

Effect of the Invention

According to the present disclosure, ease of an operation of attaching a first seal member to a shield cover improves.

DETAILED DESCRIPTION TO EXECUTE THE INVENTION

Figure 1:
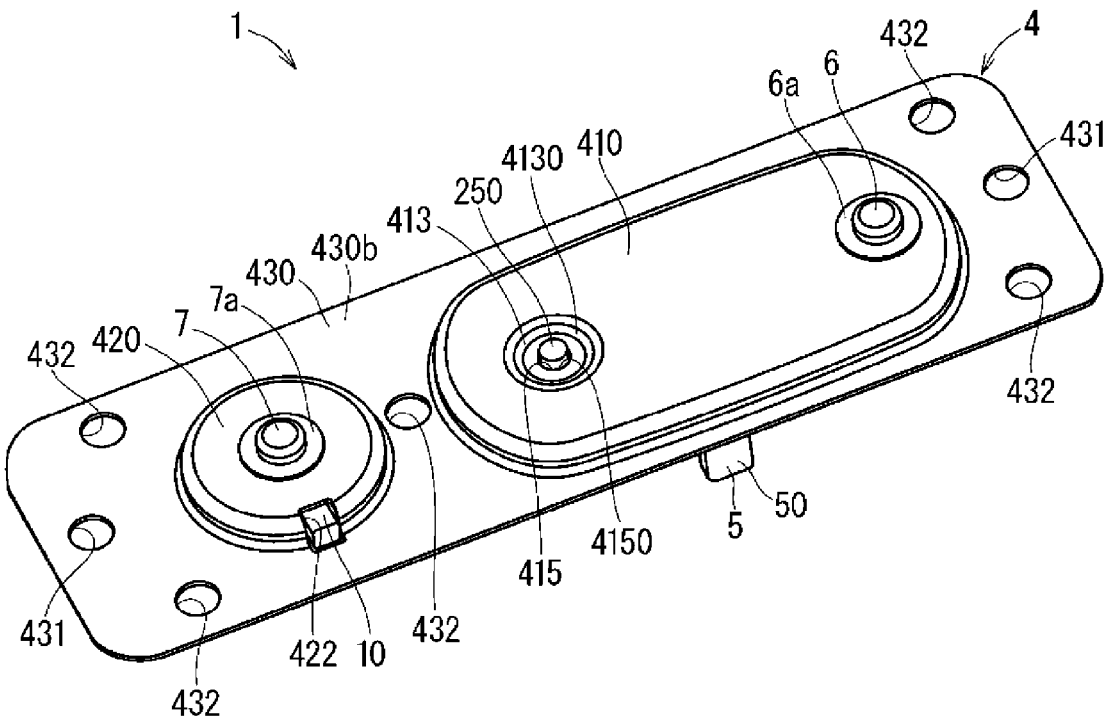
FIG. 1 is a schematic perspective view showing an example of a seal cover.

Description of Embodiments of the Present Disclosure

First, embodiments of the present disclosure will be listed and described.

A seal cover according to the present disclosure will be described as follows.

(1) A seal cover that is to be attached to an attachment target including a first opening portion and a second opening portion that is aligned with the first opening portion and is smaller than the first opening portion, and covers the first opening portion and the second opening portion, and includes: a first seal member that includes a first seal portion that is fitted into the first opening portion to seal the first opening portion, a second seal member that includes a second seal portion that is fitted into the second opening portion to seal the second opening portion, and is aligned with the first seal member, a shield cover that is attached to the first seal member and the second seal member, is to be fixed to the attachment target, and includes a first through hole and a second through hole, an interlock connector that is attached to the first seal member, and ensures attachment of the seal cover to the attachment target, a first screw that is inserted into the first through hole of the shield cover and is attached to the first seal member, and a second screw that is inserted into the second through hole of the shield cover and is attached to the second seal member, the first through hole having a first clearance therein, the second through hole having a second clearance therein, the attachment target including a partner connector that is to be mated with the interlock connector, the first seal member being movable relative to the shield cover along one plane in accordance with the first clearance, the one plane being a plane that intersects a fitting direction in which the interlock connector is mated with the partner connector, the second seal member being movable relative to the shield cover along the one plane in accordance with the second clearance independently from the first seal member, the interlock connector being attached at a position closer to a center of the first seal member than the first screw is in an alignment direction of the first seal member and the second seal member, the first screw being attached at a position displaced from the center of the first seal member to one side in the alignment direction, and the second screw being attached at a center of the second seal member. According to the present disclosure, the first screw that is inserted into the first through hole of the shield cover is attached at a position displaced from the center of the first seal member to one side in the alignment direction of the first seal member and the second seal member. Accordingly, it is easy to recognize the orientation in which the first seal member is attached to the shield cover. As a result, ease of an operation of attaching the first seal member to the shield cover improves.

(2) The first seal member may include a protrusion portion that passes through the shield cover in a state where there is a third clearance, and regulates rotation of the first seal member, and the protrusion portion may be positioned displaced from the center of the first seal member to the other side in the alignment direction. In this case, the first screw and the protrusion portion are positioned on the opposite side to each other, with the center of the first seal member therebetween. Accordingly, it is possible to prevent the movement amount of a portion of the first seal member that is on the opposite side to the first screw from becoming too large. Thus, the first seal portion of the first seal member can be easily fitted into the first opening portion.

(3) The protrusion portion may protrude from an opening provided in a recessed surface in a surface of the shield cover to the outside of the shield cover. In this case, it is possible to increase a distance by which the protrusion portion protrudes from the shield cover. Accordingly, even when the first seal member is inclined relative to the shield cover using the first screw as a support point, the protrusion portion is less likely to be detached from the shield cover.

(4) The opening may surround a base side of the protrusion portion relative to a center in the protrusion direction of the protrusion portion. In this case, the base side of the protrusion portion hits the shield cover, and thus the protrusion portion is less likely to be broken.

(5) An outer shape of the second seal member in planar view as viewed from a direction perpendicular to the one plane may be circular, and the seal cover may include a structure for stopping rotation of the second seal member. In this case, when the second screw is attached to the second seal member, the second seal member is less likely to co-rotate along with the second screw.

(6) The attachment target includes a regulation pin that regulates an attachment position of the seal cover in a direction that extends along the one plane, and protrudes in a direction opposite to the fitting direction, the interlock connector is attached to the first seal member so as to be movable relative to the first seal member along the one plane, the shield cover includes a third through hole into which the regulation pin is inserted, and a size of the first seal member in a direction that extends along the fitting direction is set such that the first seal portion is not fitted into the first opening portion in a state where the regulation pin is inserted into the third through hole, and a leading end of the interlock connector starts to be mated with the partner connector. In this case, in a state where the positions of the interlock connector and the shield cover in a direction that extends along the one plane are regulated, the first seal portion starts to be fitted into the first opening portion. When the interlock connector is movable relative to the first seal member along the one plane, and the first seal member is movable relative to the shield cover along the one plane, the first seal member is movable relative to the interlock connector and the shield cover along the one plane. Thus, even in a state where the positions of the interlock connector and the shield cover in a direction that extends along the one plane are regulated, the first seal portion of the first seal member can be easily fitted into the first opening portion.

Detailed Embodiments of Present Disclosure

Specific examples of a seal cover according to the present disclosure will be described below with reference to the drawings. Note that the present disclosure is not limited to these examples, but rather is indicated by the claims, and is intended to include all modifications that are within the meanings and the scope that are equivalent to those of the claims.

<Overview of Seal Cover>

Figure 2:
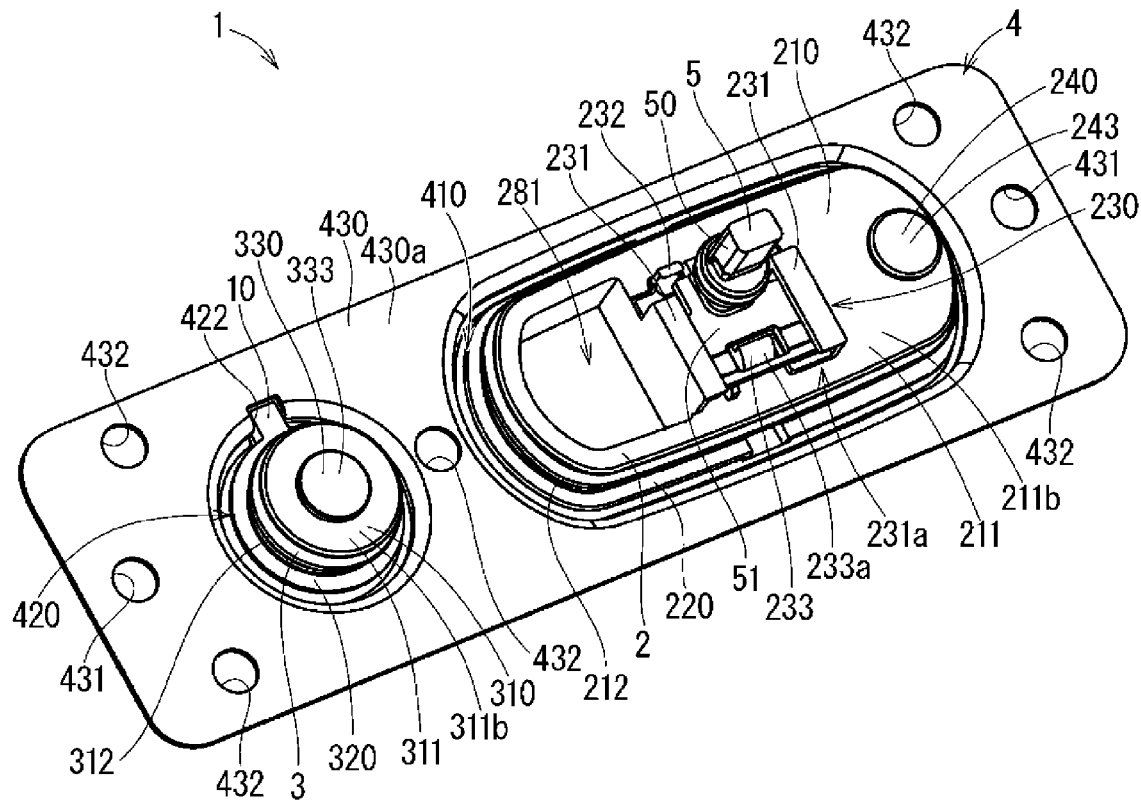
FIG. 2 is a schematic perspective view showing an example of the seal cover as viewed from the opposite side to that in FIG. 1.
Figure 3:
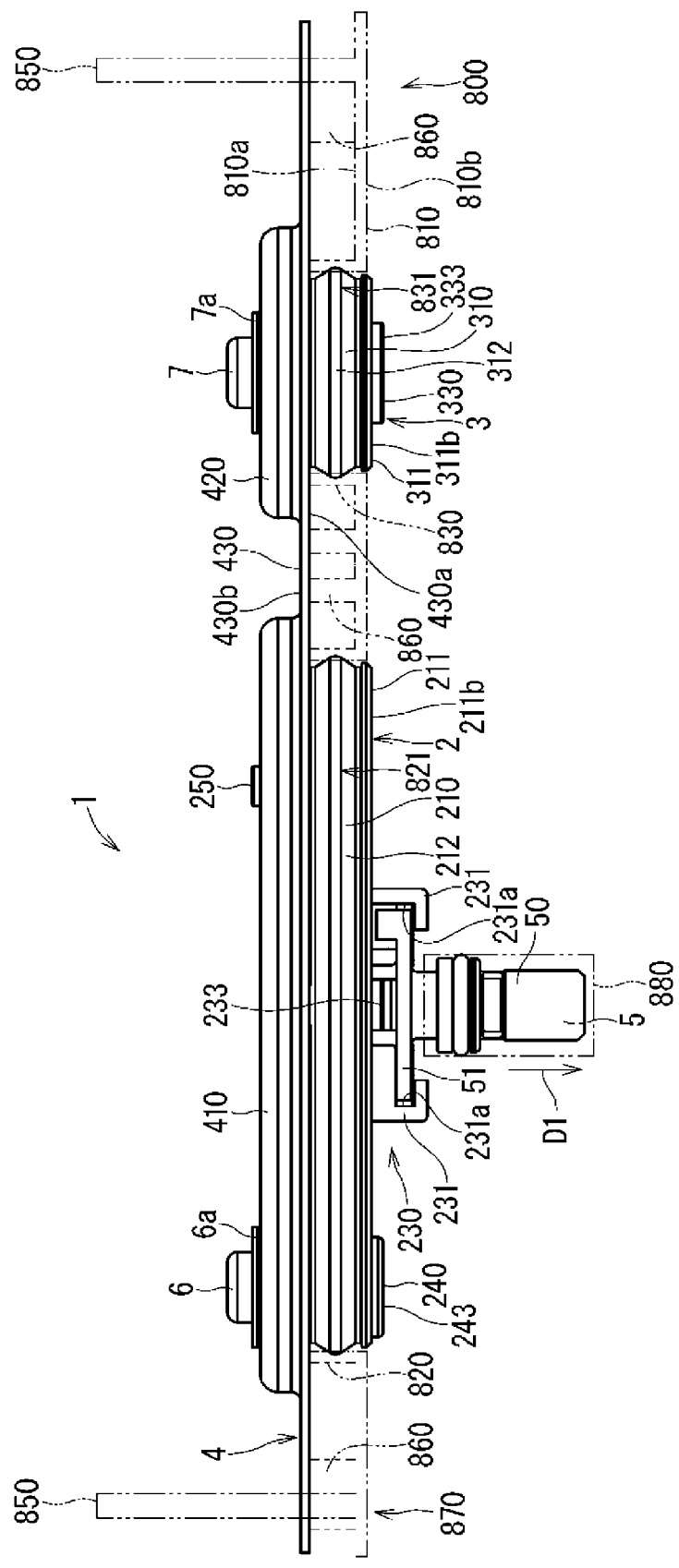
FIG. 3 is a schematic side view showing an example of the seal cover.
Figure 4:
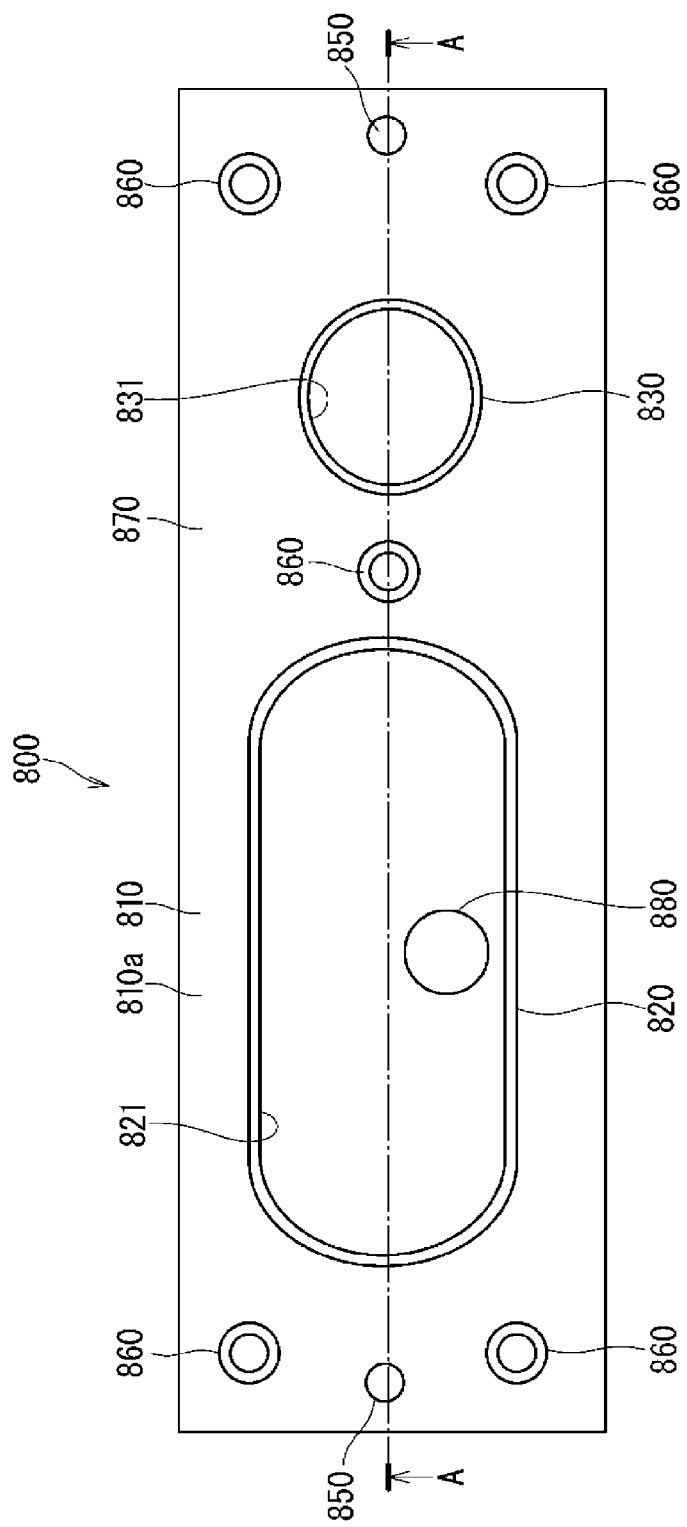
FIG. 4 is a schematic plan view showing an example of an attachment target.

FIG. 1 is a schematic perspective view showing an example of a seal cover 1. FIG. 2 is a schematic perspective view showing an example of the seal cover 1 as viewed from an angle different from that in FIG. 1. Specifically, FIG. 2 is a schematic perspective view showing an example of the seal cover 1 as viewed from the opposite side to that in FIG. 1. FIG. 3 is a schematic side view showing an example of the seal cover 1. FIG. 4 is a schematic plan view showing an example of an attachment target 800 to which the seal cover 1 is attached. In FIG. 3, a cross-sectional structure of the attachment target 800 taken along the arrow A-A shown in FIG. 4 is indicated by a dashed double-dotted line.

As shown in FIGS. 3 and 4, the attachment target 800 to which the seal cover 1 is attached includes a first opening portion 821 (also simply referred to as an "opening portion 821") and a second opening portion 831 (also simply referred to as an "opening portion 831"), for example. The second opening portion 831 is aligned with the first opening portion 821, and is smaller than the first opening portion 821. In addition, the attachment target 800 includes a partner connector 880 that is to be mated with the interlock connector 5 of the seal cover 1.

The seal cover 1 covers the opening portions 821 and 822 of the attachment target 800. As shown in FIGS. 1 to 3, the seal cover 1 includes a first seal member 2 (also simply referred to as a "seal member 2") and a second seal member 3 (also simply referred to as a "seal member 3"), a shield cover 4, and the interlock connector 5 (also simply referred to as the "connector 5"). The first seal member 2 includes a first seal portion 210 (also simply referred to as a "seal portion 210") that is fitted into the first opening portion 821, and seals the first opening portion 821. The second seal member 3 includes a second seal portion 310 (also simply referred to as a "seal portion 310") that is fitted into the second opening portion 831 and seals the second opening portion 831. The shield cover 4 is fixed to the attachment target 800, and electromagnetically shields the opening portions 821 and 831, for example. The interlock connector 5 is attached to the first seal member 2, for example, and ensures attachment of the seal cover 1 to the attachment target 800.

As a result of the opening portions 821 and 822 of the attachment target 800 being collectively sealed by the seal cover 1, water, an extraneous material, and the like are unlikely to enter the attachment target 800 from the opening portions 821 and 822, and unnecessary electromagnetic waves are unlikely to enter the attachment target 800 from the opening portions 821 and 822, and unnecessary electromagnetic waves are unlikely to be radiated to the outside from the opening portions 821 and 822.

<Configuration Example of Attachment Target>

The attachment target 800 includes a roughly plate-shaped attachment portion 870 to which the seal cover 1 is to be attached, and the partner connector 880 (also simply referred to as the "connector 880") that is to be mated with the interlock connector 5 of the seal cover 1, for example. The attachment portion 870 is made of metal such as aluminum or iron. The attachment portion 870 constitutes a portion of a housing for accommodating a plurality of components that include the partner connector 880, for example.

The attachment portion 870 includes a plate-shaped base portion 810, a first tubular portion 820, a second tubular portion 830, one or more regulation pins 850, and one or more bosses 860, which are joined to the base portion 810, for example.

The base portion 810 extends outward in a plane from the outer circumferential walls of the first tubular portion 820 and the second tubular portion 830. The outer shape of the base portion 810 is rectangular, for example. The base portion 810 includes a main surface 810a and a main surface 810b that are parallel to each other (see FIG. 3).

The first tubular portion 820 and the second tubular portion 830 are provided upright on the main surface 810a of the base portion 810. The first tubular portion 820 (also simply referred to as the "tubular portion 820") forms the first opening portion 821. The first opening portion 821 is formed by a hollow portion inside the first tubular portion 820. In other words, the first opening portion 821 is formed by space surrounded by the first tubular portion 820. The second tubular portion 830 (also simply referred to as the "tubular portion 830") forms the second opening portion 831. The second opening portion 831 is formed by a hollow portion inside the second tubular portion 830. The opening portions 821 and 831 are tubular holes, and pass through the base portion 810.

The outer shape of the opening portion 821 in planar view is elliptical, for example. The outer shape of the opening portion 831 in planar view is circular (specifically, exact circular), for example. The opening portion 831 is smaller than the opening portion 821. The opening area of the opening portion 831 is smaller than the opening area of the opening portion 821. The opening portions 821 and 831 are aligned along the longitudinal direction of the base portion 810, for example. The longitudinal direction of the elliptical opening portion 831 extends along a direction in which the opening portions 821 and 831 are aligned, in other words, the longitudinal direction of the base portion 810.

When the opening portion 821 is viewed from the main surface 810a side, the connector 880 is exposed from the opening portion 821. The connector 880 can be visually recognized when the opening portion 821 is viewed from the main surface 810a side. The connector 5 of the seal cover 1 is mated with the connector 880 from a direction perpendicular to the main surface 810a. A fitting direction D1 in which the connector 5 is mated with the connector 880 (see FIG. 3) is a direction perpendicular to the main surfaces 810a and 810b. The fitting direction D1 is also a direction that extends along the thickness direction of the base portion 810.

One or more regulation pins 850 are provided upright on the main surface 810a of the base portion 810, for example. The regulation pins 850 extend along the direction perpendicular to the main surface 810a. The regulation pins 850 protrude in the direction opposite to the fitting direction D1 of the connector 5. In this example, a plurality of regulation pins 850 are provided on the main surface 810a, but the number of regulation pins 850 may be one. Two regulation pins 850 are provided on the main surface 810a, for example.

The regulation pins 850 regulate the attachment position of the seal cover 1 in a direction that extends along the main surface 810a. When a plane that intersects the fitting direction D1 in which the connector 5 is mated with the connector 880 is defined as one plane, the regulation pins 850 regulate the attachment position of the seal cover 1 in a direction that extends along the one plane. Hereinafter, the one plane may be referred to as a "specific plane."

The two regulation pins 850 of the attachment target 800 are respectively provided at the two end portions in the longitudinal direction of the base portion 810, for example. The two regulation pins 850 are aligned along the longitudinal direction of the base portion 810, for example. The regulation pins 850 are provided at central portions of the two end portions in the longitudinal direction of the base portion 810, for example.

The one or more bosses 860 are provided upright on the main surface 810a of the base portion 810, for example. Fixing bolts for fixing the seal cover 1 to the attachment portion 870 are screwed to the bosses 860. In this example, a plurality of bosses 860 are provided on the main surface 810a, but the number of bosses 860 may be one. Five bosses 860 are provided on the main surface 810a, for example. Four bosses 860 out of the five bosses 860 are respectively provided at the four corner portions of the main surface 810a of the base portion 810, for example. The one remaining boss 860 is positioned between the opening portion 821 and the opening portion 831, for example. The boss 860 positioned between the opening portion 821 and the opening portion 831 and the two regulation pins 850 are aligned along the longitudinal direction of the base portion 810, for example.

<Configuration Example of Seal Cover>

Figure 5:
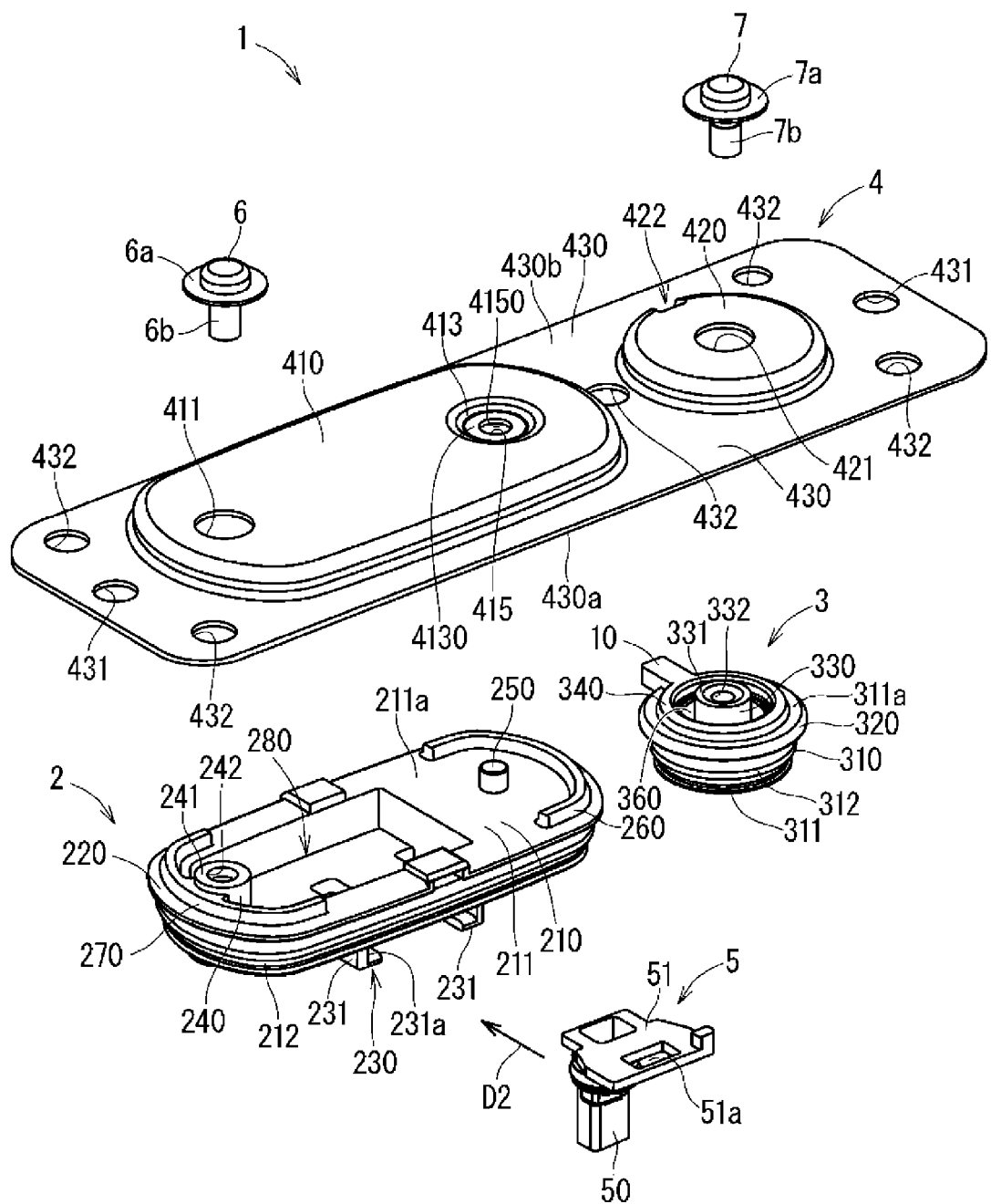
FIG. 5 is a schematic exploded perspective view showing an example of the seal cover.
Figure 6:
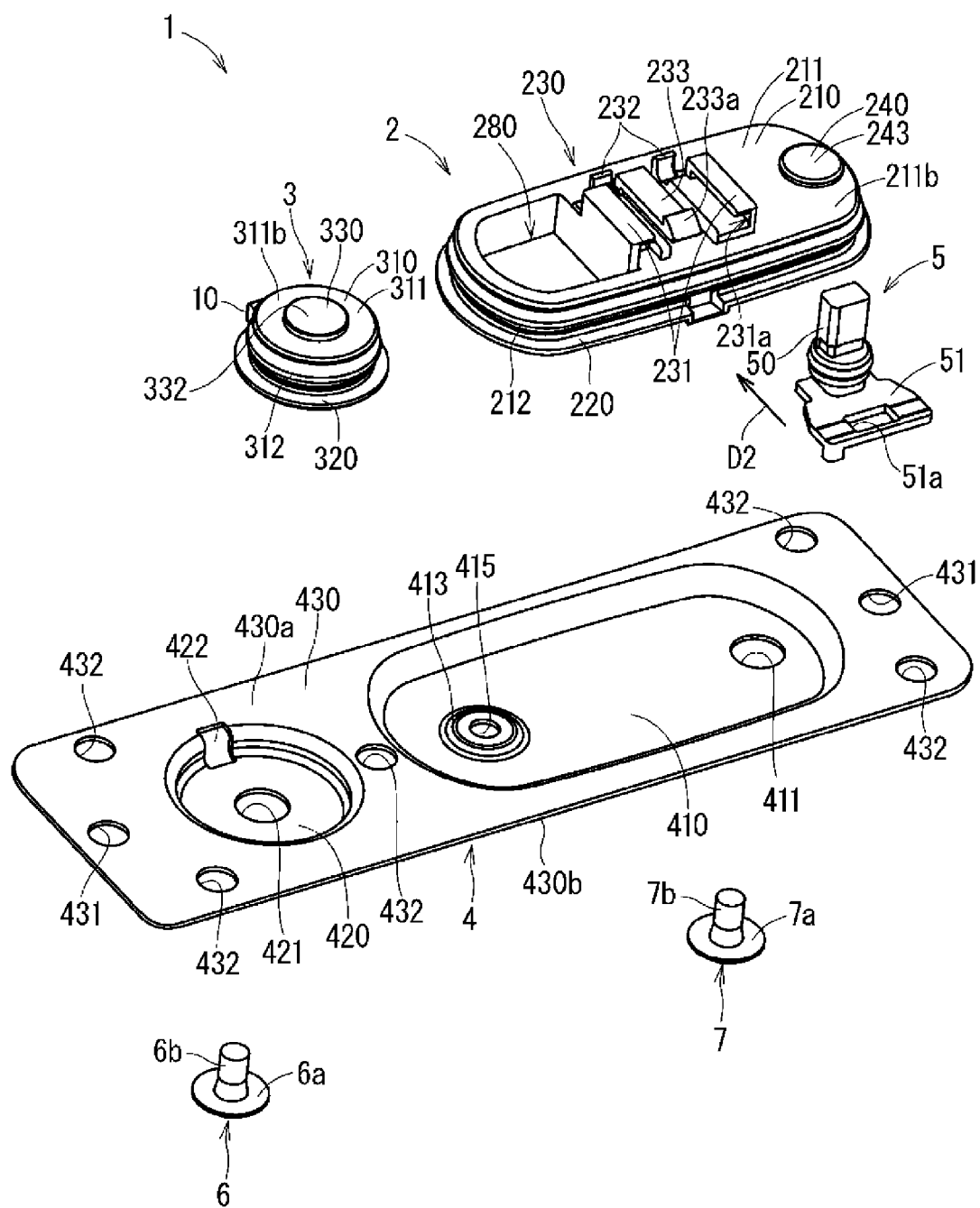
FIG. 6 is a schematic exploded perspective view showing an example of the seal cover as viewed from the opposite side to that in FIG. 5.

FIG. 5 is a schematic exploded perspective view showing an example of the seal cover 1. FIG. 6 is a schematic exploded perspective view showing an example of the seal cover 1 as viewed from an angle different from that in FIG. 5. Specifically, FIG. 6 is a schematic exploded perspective view showing an example of the seal cover 1 as viewed from the opposite side to that in FIG. 5. As shown in FIGS. 1 to 3, 5, and 6, the seal cover 1 includes a first screw 6 (also simply referred to as a "screw 6") for attaching the first seal member 2 to the shield cover 4 and a second screw 7 (also simply referred to as a "screw 7") for attaching the second seal member 3 to the shield cover 4 in addition to the first seal member 2, the second seal member 3, the shield cover 4, and the interlock connector 5. The first screw 6 passes through the shield cover 4 and is attached to the first seal member 2. The second screw 7 passes through the shield cover 4, and is attached to the second seal member 3.

<Configuration Example of Shield Cover>

The shield cover 4 is formed by pressing a metal plate made of aluminum or iron, for example. The shield cover 4 includes a plate-shaped base portion 430 that is to be fixed to the attachment portion 870 of the attachment target 800, and a first placing recessed portion 410 and a second placing recessed portion 420 joined to the base portion 430, for example. The placing recessed portions 410 and 420 are dish-shaped recessed portions, for example. The first seal member 2 is disposed in the first placing recessed portion 410 (also simply referred to as the "placing recessed portion 410"), and the second seal member 3 is disposed in the second placing recessed portion 420 (also simply referred to as the "placing recessed portion 420").

The base portion 430 extends outward in a plane from the peripheral edges of the openings of the placing recessed portions 410 and 420. The outer shape of the base portion 430 is shaped as a rectangle, for example. The base portion 430 includes a main surface 430a and a main surface 430b that are parallel to each other.

The dish-shaped placing recessed portions 410 and 420 are recessed so as to protrude to the main surface 430b side of the base portion 430. Accordingly, the placing recessed portions 410 and 420 are open on the main surface 430a side of the base portion 430. The outer shape of the opening of the placing recessed portion 410 in planar view is elliptical, for example. The outer shape of the opening of the placing recessed portion 420 in planar view is circular (specifically, exact circular), for example. The opening of the placing recessed portion 420 is smaller than the opening of the placing recessed portion 410. That is to say, the opening area of the placing recessed portion 420 is smaller than the opening area of the placing recessed portion 410. The placing recessed portions 410 and 420 are aligned along the longitudinal direction of the base portion 430, for example. The longitudinal direction of the elliptical opening of the placing recessed portion 410 extends along the alignment direction of the placing recessed portions 410 and 420, in other words, the longitudinal direction of the base portion 430.

The base portion 430 includes a plurality of through holes 431 into which the plurality of regulation pins 850 of the attachment target 800 are respectively inserted. The through holes 431 pass through the base portion 430 in the thickness direction thereof. The base portion 430 includes two through holes 431, for example. The two through holes 431 are respectively provided in the two end portions in the longitudinal direction of the base portion 430, for example. The two through holes 431 are aligned along the longitudinal direction of the base portion 430, for example. The through holes 431 are provided in central portions of the end portions in the longitudinal direction of the base portion 430.

The base portion 430 includes a plurality of through holes 432 that pass through the base portion 430 in the thickness direction thereof. A plurality of fixing bolts that are screwed to the plurality of bosses 860 of the attachment target 800 are respectively inserted into the plurality of through holes 432. The base portion 430 includes five through holes 432, for example. Four through holes 432 out of the five through holes 432 are respectively provided at the four corner portions of the base portion 430, for example. The one remaining through hole 432 is positioned between the placing recessed portion 410 and the placing recessed portion 420, for example. The through hole 432 positioned between the placing recessed portion 410 and 420, and the two through holes 431 are aligned in the longitudinal direction of the base portion 430, for example. The shield cover 4 is fixed to the attachment portion 870 of the attachment target 800, for example, using five fixing bolts. The fixing bolts are inserted into the through holes 432 of the shield cover 4, and are screwed to the bosses 860 of the attachment target 800.

As shown in FIGS. 5 and 6, a through hole 411 into which the screw 6 is inserted is provided in the elliptical bottom portion of the placing recessed portion 410. The screw 6 is inserted into the through hole 411 from the main surface 430b side of the base portion 430, and is attached to the seal member 2 disposed on the placing recessed portion 410.

The bottom portion of the placing recessed portion 410 includes a dish-shaped recessed portion 413 that is recessed to the main surface 430a side. The dish-shaped recessed portion 413 is open to the main surface 430b side. The inner surface of the dish-shaped recessed portion 413 constitutes a recessed surface 4130. The recessed surface 4130 is provided in the surface of the shield cover 4. A through hole 415 into which a later-described regulating protrusion portion 250 of the seal member 2 is inserted is provided in the bottom portion of the dish-shaped recessed portion 413. An opening 4150 on the main surface 430b side of the through hole 415 is provided in the recessed surface 4130 of the dish-shaped recessed portion 413. Specifically, the opening 4150 is provided in the bottom portion of the recessed surface 4130. The regulating protrusion portion 250 of the seal member 2 protrudes from the opening 4150 to the outside of the shield cover 4.

A through hole 421 into which the screw 7 is inserted is provided in the circular bottom portion of the placing recessed portion 420. The screw 7 is inserted into the through hole 421 from the main surface 430b side of the base portion 430, and is attached to the seal member 3 disposed on the placing recessed portion 420. In addition, a rotation stop hole 422 into which a later-described rotation stop protrusion portion 10 is inserted is provided in a side surface portion of the placing recessed portion 420. The rotation stop hole 422 is a through hole that passes through a side surface portion of the placing recessed portion 420 in the thickness direction thereof, for example. The rotation stop protrusion portion 10 and the rotation stop hole 422 constitute a rotation stop structure for stopping rotation of the seal member 3. The rotation stop structure will be described later in detail.

<Configuration Example of First Seal Member and Interlock Connector>

The first seal member 2 is made of a resin, for example. The outer shape of the first seal member 2 in planar view as viewed from a direction perpendicular to a specific plane (that is to say, a plane that intersects the fitting direction D1) is elliptical, for example. The first seal member 2 includes the first seal portion 210, an annular flange portion 220 that protrudes outward from the peripheral edge of the first seal portion 210, a connector holding portion 230 for holding the connector 5, and a boss 240 to which the screw 6 is attached, for example. Furthermore, the first seal member 2 includes the regulating protrusion portion 250, and abutment ribs 260 and 270 that abut on the bottom portion of the first placing recessed portion 410 of the shield cover 4 when the first seal member 2 is disposed on the first placing recessed portion 410, for example.

The seal portion 210 that is fitted into the opening portion 821 of the attachment target 800 includes a main body portion 211 and a seal ring 212 attached to the main body portion 211, for example. The main body portion 211 is shaped as a slightly flat column, for example. The outer shape of the main body portion 211 in planar view as viewed from a direction perpendicular to the specific plane is elliptical in accordance with the outer shape of the opening portion 821 in planar view, for example. The seal ring 212 is attached to the side surface (in other words, the outer peripheral surface) of the main body portion 211. Specifically, an annular groove is formed in the side surface of the main body portion 211, and the seal ring 212 is fitted into the annular groove. In a state where the seal portion 210 is fitted into the opening portion 821, the seal ring 212 comes into intimate contact with the inner circumferential wall of the opening portion 821 (in other words, the inner periphery surface of the tubular portion 820) in a watertight manner, and the opening portion 821 is sealed by the seal portion 210. The main body portion 211, the flange portion 220, the connector holding portion 230, the boss 240, the regulating protrusion portion 250, the abutment rib 260 and the abutment rib 270 are integrally formed, for example.

The main body portion 211 includes planes 211a and 211b that are parallel to each other. The seal member 2 is disposed in the placing recessed portion 410 such that the flat surface 211a of the main body portion 211 is positioned on the placing recessed portion 410 side of the shield cover 4. The main body portion 211 includes a thinned portion 280 that is open in the flat surface 211a and a thinned portion 281 that is open in the flat surface 211b.

The flange portion 220 extends outward from an end portion on the flat surface 211a side of the peripheral side surface of the main body portion 211, so as to surround the end portion. The flange portion 220 has an elliptical annular shape in accordance with the outer shape of the main body portion 211 in planar view.

The abutment ribs 260 and 270 are provided upright on the flat surface 211a of the main body portion 211. The abutment rib 260 is provided at one end portion in the longitudinal direction of the flat surface 211a of the main body portion 211. The abutment rib 270 is provided at the other end portion in the longitudinal direction of the flat surface 211a of the main body portion 211. The abutment ribs 260 and 270 extend in an arc shape along the outer edges of the end portions in the longitudinal direction of the flat surface 211a. In a state where the seal member 2 is disposed in the placing recessed portion 410, the abutment ribs 260 and 270 abut on the inner bottom surface of the placing recessed portion 410.

The boss 240 to which the screw 6 is attached is provided on the main body portion 211, for example. The boss 240 is positioned at one end portion in the longitudinal direction of the main body portion 211. The boss 240 is shaped as a hollow column, for example. The boss 240 extends from the flat surface 211b side to the flat surface 211a side along the thickness direction of the main body portion 211. There is the thinned portion 280 around the boss 240. A lower hole 242 is provided in the boss 240. The lower hole 242 is open in a leading end surface 241 of the boss 240. An outer bottom surface 243 of the boss 240 is closed, and protrudes outward of the flat surface 211b of the main body portion 211. When the seal member 2 is disposed in the placing recessed portion 410 of the shield cover 4, the boss 240 is inserted into the through hole 411 of the placing recessed portion 410 from the main surface 430a side. In a state where the boss 240 is inserted into the through hole 411, the boss 240 protrudes from the shield cover 4, and the leading end surface 241 of the boss 240 is positioned outside the shield cover 4. The leading end surface 241 is positioned outward of the outer surface of (in other words, the surface on the main surface 430b side) of the placing recessed portion 410.

The screw 6 is a tap screw (also referred to as a "tapping screw") that includes a washer head, for example. A screw portion 6b of the screw 6 is inserted into the lower hole 242 of the boss 240 inserted into the through hole 411 of the shield cover 4, from the main surface 430b side, and is then screwed into the boss 240. At this time, a washer 6a of the screw 6 abuts on the leading end surface 241 of the boss 240 that protrudes to the outside of the shield cover 4, and does not come into contact with the shield cover 4. Moreover, the diameter of the washer 6a is larger than the diameter of the through hole 411, and thus the screw 6 attached to the boss 240 is unlikely to come loose through the through hole 411 to the main surface 430a side. Accordingly, the seal member 2 is attached to the shield cover 4. The screw 6 is attached at a position displaced from the center of the seal member 2 to one side of the longitudinal direction of the seal member 2. In other words, the screw 6 is attached at a position displaced on one side in the alignment direction of the seal members 2 and 3, from the center of the seal member 2.

In this example, the outer bottom surface 243 of the boss 240 protrudes outward of the flat surface 211b of the main body portion 211, and thus it is possible to increase the thickness of the bottom portion of the boss 240. Accordingly, even when the screw 6 is excessively screwed to the boss 240, the leading end of the screw 6 is unlikely to protrude from the outer bottom surface 243 of the boss 240.

The regulating protrusion portion 250 is provided on the flat surface 211a of the main body portion 211. The regulating protrusion portion 250 has a columnar shape, for example. The regulating protrusion portion 250 is positioned, for example, at the other end portion in the longitudinal direction of the main body portion 211 (that is to say, the end portion on the opposite side to the side on which the boss 240 is positioned). The regulating protrusion portion 250 is positioned on the other side in the longitudinal direction of the seal member 2 (that is to say, on the opposite side to the side on which the boss 240 is positioned) relative to the center of the seal member 2. In other words, the regulating protrusion portion 250 is positioned displaced from the center of the seal member 2 to the other side in the alignment direction of the seal members 2 and 3. The regulating protrusion portion 250 is inserted into the through hole 415 of the placing recessed portion 410 from the main surface 430a side. The regulating protrusion portion 250 regulates rotation of the seal member 2. The operation of the regulating protrusion portion 250 will be described later in detail.

The connector holding portion 230 (also simply referred to as the "holding portion 230") can movably hold the connector 5. The connector 5 includes a fitting portion 50 that is to be mated with the connector 880, and a held portion 51 that is held on the holding portion 230. The held portion 51 is shaped as a plate, and is slidably inserted into the holding portion 230 and held on the holding portion 230. The connector 5 is attached at a position closer to the center of the seal member 2 than the screw 6 is in the alignment direction of the seal members 2 and 3 (in other words, the longitudinal direction of the main body portion 211).

The holding portion 230 is provided on the flat surface 211b of the main body portion 211, for example. The holding portion 230 is positioned at a central portion in the longitudinal direction of the flat surface 211b, for example. The holding portion 230 includes a pair of slide support portions 231, a pair of farther-side receiving portions 232, and a coming-off preventing structure 233, for example. The pair of slide support portions 231 oppose each other in the longitudinal direction of the main body portion 211 with space therebetween. The held portion 51 of the connector 5 is disposed between the pair of slide support portions 231. A pair of guide grooves 231a are respectively formed on the inner side of the pair of slide support portions 231. The guide grooves 231a extend along a slide movement direction D2 of the connector 5 (see FIGS. 5 and 6). The two end portions of the held portion 51 that has slidably moved are respectively inserted into the pair of guide grooves 231a. The slide movement direction D2 is a direction that extends along the flat surface 211b, and is a direction perpendicular to the longitudinal direction of the main body portion 211 (in other words, a direction perpendicular to the alignment direction of the seal members 2 and 3), for example. The slide movement direction D2 and the longitudinal direction of the main body portion 211 are directions that extend along a specific plane (that is to say, a plane that intersects the fitting direction D1 of the connector 5).

The pair of farther-side receiving portions 232 are shaped as plates, and are disposed with space therebetween in the longitudinal direction of the main body portion 211. The pair of farther-side receiving portions 232 are provided at positions opposing the held portion 51 that has slidably moved, on the farther side in the slide movement direction D2. The pair of farther-side receiving portions 232 may be joined to each other so as to form one farther-side receiving portion.

The coming-off preventing structure 233 is formed as a cantilever plate spring, for example, and is shaped as a plate. The coming-off preventing structure 233 extends along the slide movement direction D2. The base end of the coming-off preventing structure 233 that is a plate spring is fixed to the main body portion 211. An engagement protrusion 233a that is to be engaged with an engagement hole 51a provided in the held portion 51 of the connector 5 is provided on a leading end of the coming-off preventing structure 233. The leading end of the coming-off preventing structure 233 can elastically bend so as to approach the main body portion 211.

The two end portions of the held portion 51 in the direction perpendicular to the slide movement direction D2 and the fitting direction D1 are respectively inserted into the pair of guide grooves 231a. The held portion 51 then proceeds to the farther side in the slide movement direction D2 along the guide grooves 231a. At this time, the held portion 51 slidably moves while pressing the engagement protrusion 233a of the coming-off preventing structure 233 to the main body portion 211 side. When the held portion 51 further proceeds to the farther side in the slide movement direction D2, an elastically bent state of the coming-off preventing structure 233 is cancelled, and the engagement protrusion 233a engages with engagement hole 51a of the held portion 51. Accordingly, the held portion 51 is held on the holding portion 230.

The connector 5 in a state of being held on the holding portion 230 has entered a floating state where the connector 5 is movable relative to the holding portion 230. The connector 5 is attached to the seal member 2 so as to be movable relative to the seal member 2 along the specific plane (that is to say, a plane that intersects the fitting direction D1 of the connector 5). The connector 5 is movable along the slide movement direction D2, for example. Furthermore, the connector 5 is movable along the longitudinal direction of the main body portion 211. Movement of the connector 5 to the farther side in the slide movement direction D2 is restricted by the pair of farther-side receiving portions 232, and movement of the connector 5 to the front side in the slide movement direction D2 is restricted by engagement between the engagement protrusion 233a and the engagement hole 51a. Movement of the connector 5 along the longitudinal direction of the main body portion 211 is restricted by the pair of slide support portions 231.

Two connection terminals short-circuited to each other are provided in the fitting portion 50 of the connector 5. In addition, the connector 880 includes two connection terminals electrically connected to a predetermined circuit of the attachment target 800. In a state where the seal cover 1 is attached to the attachment target 800, and the connector 5 and the connector 880 are mated with each other, the two connection terminals of the connector 5 are electrically connected to the two connection terminals of the connector 880, respectively. Accordingly, the two connection terminals of the connector 880 are short-circuited to each other. Since the two connection terminals of the connector 880 are short-circuited to each other in this manner when the seal cover 1 is attached to the attachment target 800, the predetermined circuit connected to the two connection terminals can recognize that the seal cover 1 has been attached to the attachment target 800. Thus, the predetermined circuit can perform appropriate processing in response to the seal cover 1 being attached to the attachment target 800. In this example, as a result of the interlock connector 5 being mated with the partner connector 880, the two connection terminals of the partner connector 880 are short-circuited, thus ensuring attachment of the seal cover 1 to the attachment target 800.

As described above, in this example, the interlock connector 5 is attached to the seal member 2 so as to be movable relative to the seal member 2 along the specific plane. Here, a manufacturing error, an attachment error, or the like may occur at the position at which the partner connector 880 is disposed. In addition, a manufacturing error, an attachment error, or the like may also occur at the position at which the interlock connector 5 is held on the seal member 2. Since the interlock connector 5 is movable relative to the seal member 2 along the specific plane, such an error is absorbed, and the interlock connector 5 can be easily mated with the partner connector 880. Thus, ease of an operation of mating the interlock connector 5 with the partner connector 880 improves.

<Configuration Example of Second Seal Member>

The second seal member 3 is made of a resin, for example. The outer shape of the second seal member 3 in planar view as viewed from a direction perpendicular to the specific plane is circular (specifically, exact circular), for example. The second seal member 3 includes the second seal portion 310, an annular flange portion 320 that protrudes outward from the peripheral edge of the second seal portion 310, and a boss 330 to which the screw 7 is attached, for example. Furthermore, the second seal member 3 includes an abutment rib 340 that abuts on the bottom portion of the second placing recessed portion 420 when the second seal member 3 is disposed in the second placing recessed portion 420 of the shield cover 4, for example.

The seal portion 310 that is to be fitted into the opening portion 831 of the attachment target 800 includes a main body portion 311 and a seal ring 312 attached to the main body portion 311, for example. The main body portion 311 has a columnar shape, for example. The outer shape of the main body portion 311 in planar view as viewed from a direction perpendicular to the specific plane is circular (specifically, exact circular) in accordance with the outer shape of the opening portion 831 in planar view, for example. The seal ring 312 is attached to the side surface of the main body portion 311. Specifically, an annular groove is provided in the side surface of the main body portion 311, and the seal ring 312 is fitted into the annular groove. In a state where the seal portion 310 is fitted into the opening portion 831, the seal ring 312 comes into intimate contact with the inner circumferential wall of the opening portion 831 in a watertight manner, and the opening portion 831 is sealed by the seal portion 310. The main body portion 311, the flange portion 320, the boss 330, and the abutment rib 340 are integrally formed, for example.

The main body portion 311 includes a flat surface 311*a* and a flat surface 311*b* that are parallel to each other. The seal member 3 is disposed in the placing recessed portion 420 such that the flat surface 311*a* of the main body portion 311 is positioned on the placing recessed portion 420 side of the shield cover 4. The main body portion 311 includes a thinned portion 360 that is open in the flat surface 311*a*.

The flange portion 320 extends outward from an end portion on the flat surface 311*a* side of the peripheral side surface of the main body portion 311 so as to surround the end portion. The flange portion 320 has a circular shape (specifically, exact circular shape) in accordance with the shape of the main body portion 311 in planar view.

The abutment rib 340 is provided upright on the flat surface 311*a* of the main body portion 311. The abutment rib 340 extends in a circle (specifically, an exact circle) along the edge of the circular flat surface 311*a*, for example. In a state where the seal member 3 is disposed in the placing recessed portion 420, the abutment rib 340 abuts on the inner bottom surface of the placing recessed portion 420.

The boss 330 to which the screw 7 is attached is provided on the main body portion 311, for example. The boss 330 is positioned at a central portion of the main body portion 311. The boss 330 has a hollow columnar shape, for example. The boss 330 extends from the flat surface 311*b* side to the flat surface 311*a* side along the thickness direction of the main body portion 311. There is the thinned portion 360 around the boss 330. A lower hole 332 is provided in the boss 330. The lower hole 332 is open in a leading end surface 331 of the boss 330. An outer bottom surface 333 of the boss 330 is closed, and protrudes outward of the flat surface 311*b* of the main body portion 311. When the seal member 3 is disposed in the placing recessed portion 420 of the shield cover 4, the boss 330 is inserted into the through hole 421 of the placing recessed portion 420 from the main surface 430*a* side. In a state where the boss 330 is inserted into the through hole 421, the leading end surface 331 of the boss 330 is positioned outside the shield cover 4. That is to say, the leading end surface 331 is positioned outward of the outer surface (in other words, the surface on the main surface 430*b* side) of the placing recessed portion 420.

The screw 7 is a tap screw that includes a washer head, for example. A screw portion 7*b* of the screw 7 is inserted into the lower hole 332 of the boss 330 inserted into a through hole 412 of the shield cover 4, from the main surface 430*b* side, and is screwed into the boss 330. At this time, a washer 7*a* of the screw 7 abuts on the leading end surface 331 of the boss 330 that protrudes to the outside of the shield cover 4, and does not come into contact with the shield cover 4. Moreover, the diameter of the washer 7*a* is larger than the diameter of the through hole 421, and thus the screw 7 attached to the boss 330 is unlikely to come loose through the through hole 421 to the main surface 430*a* side. Accordingly, the seal member 3 is attached to the shield cover 4. The screw 7 is screwed into the center of the seal member 3, and is attached to the center.

In this example, the outer bottom surface 333 of the boss 330 protrudes outward of the flat surface 311*b* of the main body portion 311, and thus it is possible to increase the thickness of the bottom portion of the boss 330. Accordingly, even if the screw 7 is excessively screwed into the boss 330, the leading end of the screw 7 is unlikely to protrude from the outer bottom surface 333 of the boss 330.

<Example of Rotation Stop Structure of Second Seal Member>

In this example, the outer shape of the seal member 3 in planar view as viewed from a direction perpendicular to the specific plane is circular. For this reason, when the screw 7 is screwed into the boss 330 of the seal member 3, there is the possibility that the seal member 3 will co-rotate with the screw 7.

In view of this, the seal cover 1 includes the rotation stop structure of the seal member 3. The rotation stop structure is constituted by the above-described rotation stop hole 422 provided in the shield cover 4, and the rotation stop protrusion portion 10 that is inserted into the rotation stop hole 422, for example. The rotation stop protrusion portion 10 protrudes outward from the flange portion 320 of the seal member 3 and the outer circumferential wall of the abutment rib 340 along the radial direction of the circular flat surface 311*a*, for example. The rotation stop protrusion portion 10 is integrally formed with the flange portion 320 and the abutment rib 340, for example. When the seal member 3 is disposed in the placing recessed portion 420 of the shield cover 4, the rotation stop protrusion portion 10 is inserted into the rotation stop hole 422 provided on a side surface portion of the placing recessed portion 420. Accordingly, when the seal member 3 is about to co-rotate along with the screw 7, the rotation stop protrusion portion 10 hits the inner peripheral wall of the rotation stop hole 422, and the seal member 3 is unlikely to co-rotate.

<Floating of Seal Member>

The first seal member 2 in a state of being attached to the shield cover 4 is in a floating state in which the first seal member 2 is movable relative to the shield cover 4. Similarly, the second seal member 3 in a state of being attached to the shield cover 4 is in a floating state in which the second seal member 3 is movable relative to the shield cover 4.

Figure 7:
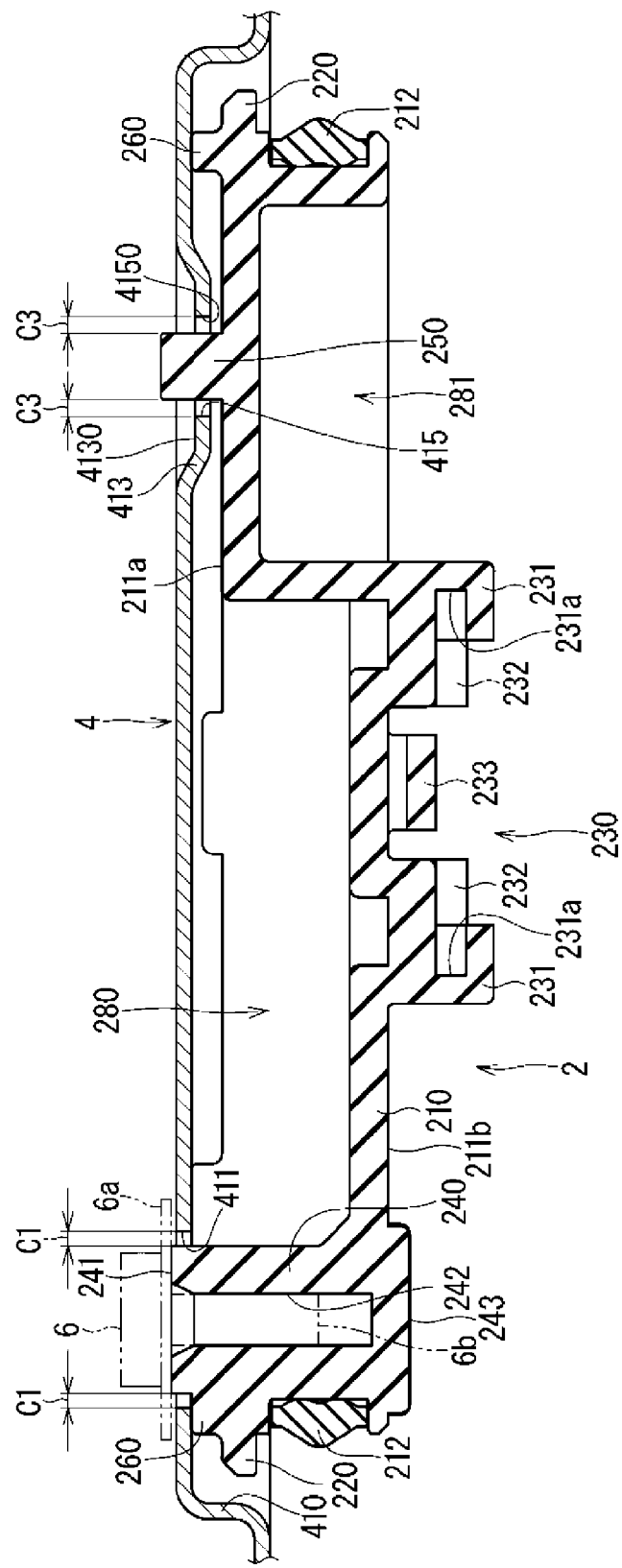
FIG. 7 is a schematic diagram showing an example of a cross-sectional structure of a shield cover and a first seal member.
Figure 8:
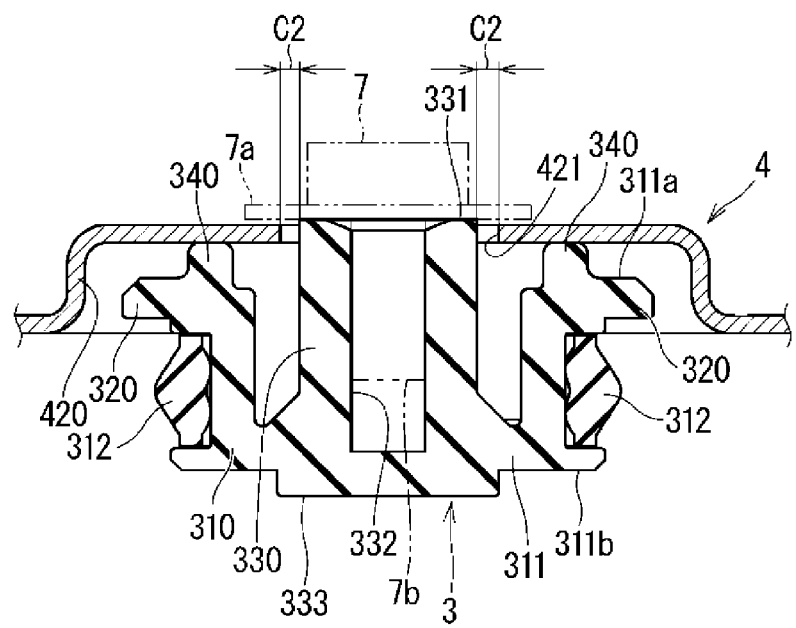
FIG. 8 is a schematic diagram showing an example of a cross-sectional structure of the shield cover and a second seal member.

FIG. 7 is a schematic diagram showing an example of a cross-sectional structure of the shield cover 4 and the first seal member 2. In FIG. 7, the screw 6 attached to the first seal member 2 is indicated by the dashed double-dotted line. FIG. 8 is a schematic diagram showing an example of a cross-sectional structure of the shield cover 4 and the second seal member 3. In FIG. 8, the screw 7 attached to the second seal member 3 is indicated by the dashed double-dotted line.

As shown in FIG. 7, there is a first clearance C1 (also simply referred to as a "clearance C1") in the through hole 411 provided in the bottom portion of the placing recessed portion 410 of the shield cover 4, that is to say, the through hole 411 into which the screw 6 is inserted. In this example, there is the clearance C1 between the inner circumferential wall of the through hole 411 and the outer circumferential wall of the boss 240 inserted into the through hole 411.

In addition, as shown in FIG. 8, there is a second clearance C2 (also simply referred to as a "clearance C2") in the through hole 421 provided in the bottom portion of the placing recessed portion 420 of the shield cover 4, that is to say, the through hole 421 into which the screw 7 is inserted. In this example, there is the clearance C2 between the inner circumferential wall of the through hole 421 and the outer circumferential wall of the boss 330 inserted into the through hole 421.

In addition, as shown in FIG. 7, there is a third clearance C3 (also simply referred to as a "clearance C3") in the through hole 415 provided in the bottom portion of the placing recessed portion 410 of the shield cover 4, that is to say, the through hole 415 into which the regulating protrusion portion 250 of the seal member 2 is inserted. The regulating protrusion portion 250 passes through the shield cover 4 in a state where there is the third clearance C3. The clearance C3 is between the inner circumferential wall of the through hole 415 and the outer circumferential wall of the regulating protrusion portion 250.

The seal member 2 is movable relative to the shield cover 4 along the specific plane (that is to say, a plane that intersects the fitting direction D1 of the connector 5) in accordance with the clearance C1. In other words, the seal member 2 is movable relative to the shield cover 4 along the main surface 430a and the main surface 430b of the base portion 430 of the shield cover 4 in accordance with the clearance C1.

The seal member 2 is movable in all directions centered on the central axis of the through hole 411 along the specific plane, for example. The seal member 2 can move along the longitudinal direction of the shield cover 4, for example. In addition, the seal member 2 can move along a direction that is perpendicular to the longitudinal direction of the shield cover 4 and that extends along a direction that extends along the specific plane. In addition, the seal member 2 can move in another direction that extends along the specific plane.

In addition, the seal member 2 can rotate relative to the shield cover 4 along the specific plane, using the boss 240 as a support point, and move relative to the shield cover 4. In other words, the seal member 2 can rotate relative to the shield cover 4 along the specific plane using the screw 6 as a support point, and move relative to the shield cover 4. The seal member 2 moving relative to the shield cover 4 along the specific plane also includes the seal member 2 rotating relative to the shield cover 4 along the specific plane using the boss 240 and the screw 6 as support points. The seal member 2 can rotate both clockwise and counter-clockwise using the screw 6 as a support point, for example.

The regulating protrusion portion 250 can regulate rotation of the seal member 2 in accordance with the clearance C3, by being inserted into the through hole 415 of the shield cover 4. When the seal member 2 rotates relative to the shield cover 4 along the specific plane using the screw 6 as a support point, the regulating protrusion portion 250 hits the inner circumferential wall of the through hole 415, and rotation of the seal member 2 is regulated. The maximum rotation amount of the seal member 2 depends on the clearance C3. In this example, the clearance C3 is set to be larger than the clearance C1. For this reason, the maximum amount of movement of the entire seal member 2 from the central axis of the through hole 411 along the specific plane depends on the clearance C1.

In this manner, the seal member 2 is movable relative to the shield cover 4 along the specific plane in this example. Here, a manufacturing error, an attachment error, or the like may occur at the position where the opening portion 821 into which the seal portion 210 of the seal member 2 is fitted is disposed. In addition, a manufacturing error, an attachment error, or the like may also occur at the position of the seal member 2 relative to the shield cover 4. Since the seal member 2 is movable relative to the shield cover 4 along the specific plane, such an error can be absorbed, and the seal portion 210 can be easily fitted into the opening portion 821. Thus, ease of an operation of fitting the seal portion 210 into the opening portion 821 improves.

In this example, one end portion in the longitudinal direction of the seal member 2 is attached to the shield cover 4 using the screw 6. In contrast, the regulating protrusion portion 250 merely passes through the shield cover 4, and the other end portion in the longitudinal direction of the seal member 2 is not attached to the shield cover 4. In such a case, when only the shield cover 4 out of the shield cover 4 and the seal member 2 is held, or the like, the seal member 2 may be inclined using the one end portion thereof as a support point, such that the other end portion separates from the shield cover 4. That is to say, the seal member 2 may be inclined relative to the shield cover 4 using the screw 6 as a support point. At this time, if the amount of protrusion of the regulating protrusion portion 250 from the shield cover 4 is small, there is the possibility that the regulating protrusion portion 250 will come loose from the through hole 415 and be detached from the shield cover 4.

In this example, the regulating protrusion portion 250 protrudes from the opening 4150 provided in the recessed surface 4130 of the surface of the shield cover 4 (that is to say, the opening on the main surface 430b side of the through hole 415) to the outside of the shield cover 4. Accordingly, it is possible to increase the amount of protrusion of the regulating protrusion portion 250 from the shield cover 4. As a result, even when the seal member 2 is inclined relative to the shield cover 4 using the screw 6 as a support point, the regulating protrusion portion 250 is unlikely to be detached from the shield cover 4.

Figure 9:
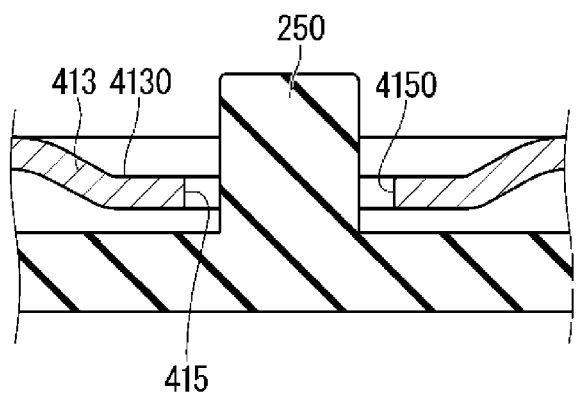
FIG. 9 is a schematic diagram showing an example of a cross-sectional structure of the second seal member.

Note that the periphery of the opening 4150 may surround the base side (in other words, the base end side or the main body portion 211 side) of the regulating protrusion portion 250 relative to the center in the protrusion direction of the regulating protrusion portion 250, as shown in FIG. 9, for example. When a portion on the leading end side of the regulating protrusion portion 250 hits the inner circumferential wall of the through hole 415 of the shield cover 4, there is the possibility that the regulating protrusion portion 250 will be broken. By the opening 4150 surrounding the base side of the regulating protrusion portion 250 relative to the center in the protrusion direction of the regulating protrusion portion 250 as in the example in FIG. 9, the base side of the regulating protrusion portion 250 hits the shield cover 4. Accordingly, the regulating protrusion portion 250 is less likely to be broken.

The seal member 3 is movable relative to the shield cover 4 along the specific plane in accordance with the clearance C2 independently from the seal member 2. Similarly to the seal member 2, the seal member 3 is movable in all directions centered on central axis of the through hole 421 along the specific plane, for example. The seal member 3 can move along the longitudinal direction of the shield cover 4, for example. In addition, the seal member 3 can move along a direction that is perpendicular to the longitudinal direction of the shield cover 4, and that extends along the specific plane. In addition, the seal member 3 can move along another direction that extends along the specific plane. In this example, in a state where the rotation stop protrusion portion 10 is inserted into the rotation stop hole 42, there is a clearance between the inner peripheral wall of the rotation stop hole 422 and the rotation stop protrusion portion 10. For this reason, the seal member 3 is movable in all directions centered on the central axis of the through hole 421 along the specific plane.

In addition, in a state of being attached to the shield cover 4 using the screw 7, the seal member 3 can rotate about the boss 330 and the screw 7 along the specific plane relative to the shield cover 4. Such rotation of the seal member 3 is regulated by the rotation stop structure. When the seal member 3 rotates in a state where the seal member 3 is attached to the shield cover 4, the rotation stop protrusion portion 10 extending from the seal member 3 hits the inner peripheral wall of the rotation stop hole 42, and rotation of the seal member 3 is regulated.

In this manner, in this example, the seal member 3 is movable relative to the shield cover 4 along the specific plane. Similarly to the opening portion 821, a manufacturing error, an attachments error, or the like may occur at the position where the opening portion 831 into which the seal portion 310 of the seal member 3 is fitted is disposed. In addition, a manufacturing error, an attachments error, or the like may also occur at the position of the seal member 3 relative to the shield cover 4. Since the seal member 3 is movable relative to the shield cover 4 along the specific plane, such an error can be absorbed. Thus, the seal portion 310 is likely to be fitted into the opening portion 831. As a result, ease of an operation of fitting the seal portion 310 into the opening portion 831 improves.

<Example of Method for Attaching Seal Cover to Attachment Target>

Figure 10:
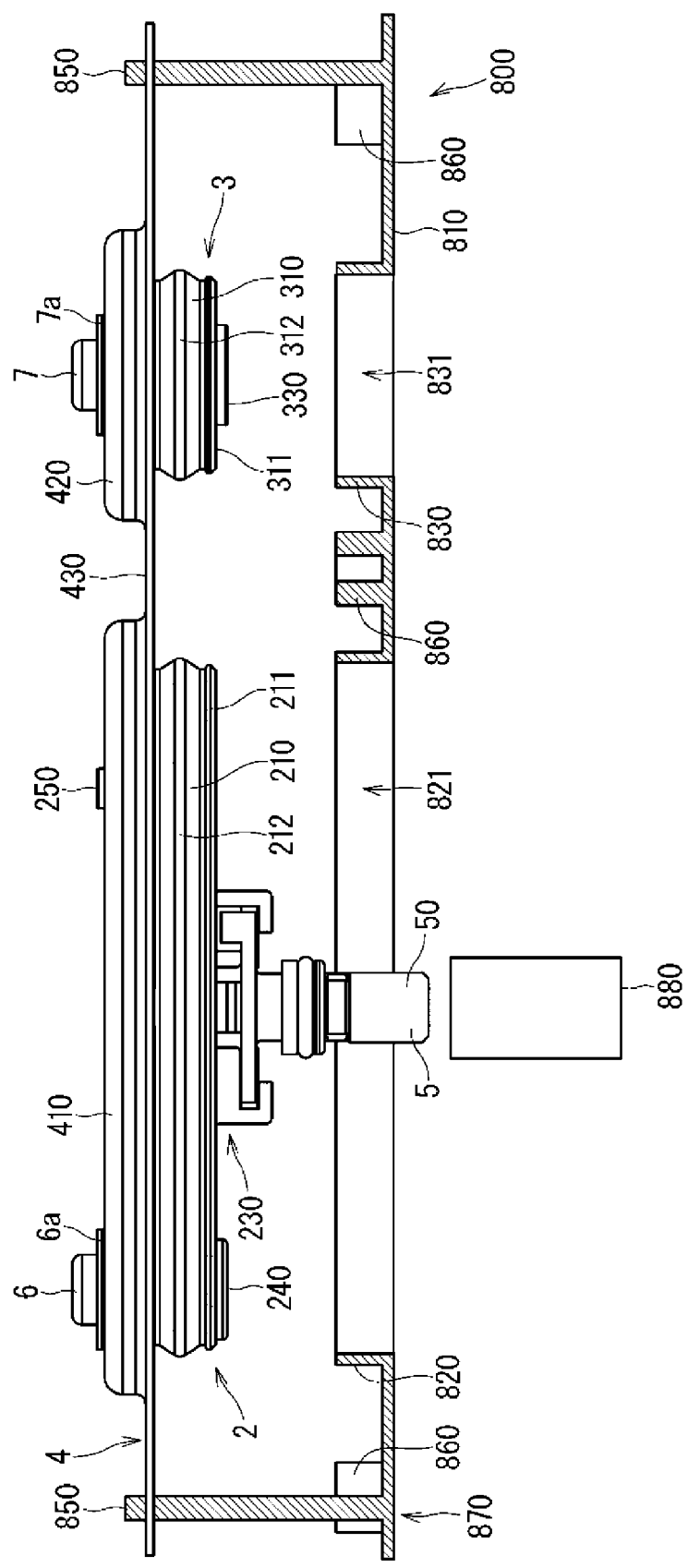
FIG. 10 is a schematic diagram showing an example of a process of attaching the seal cover.
Figure 11:
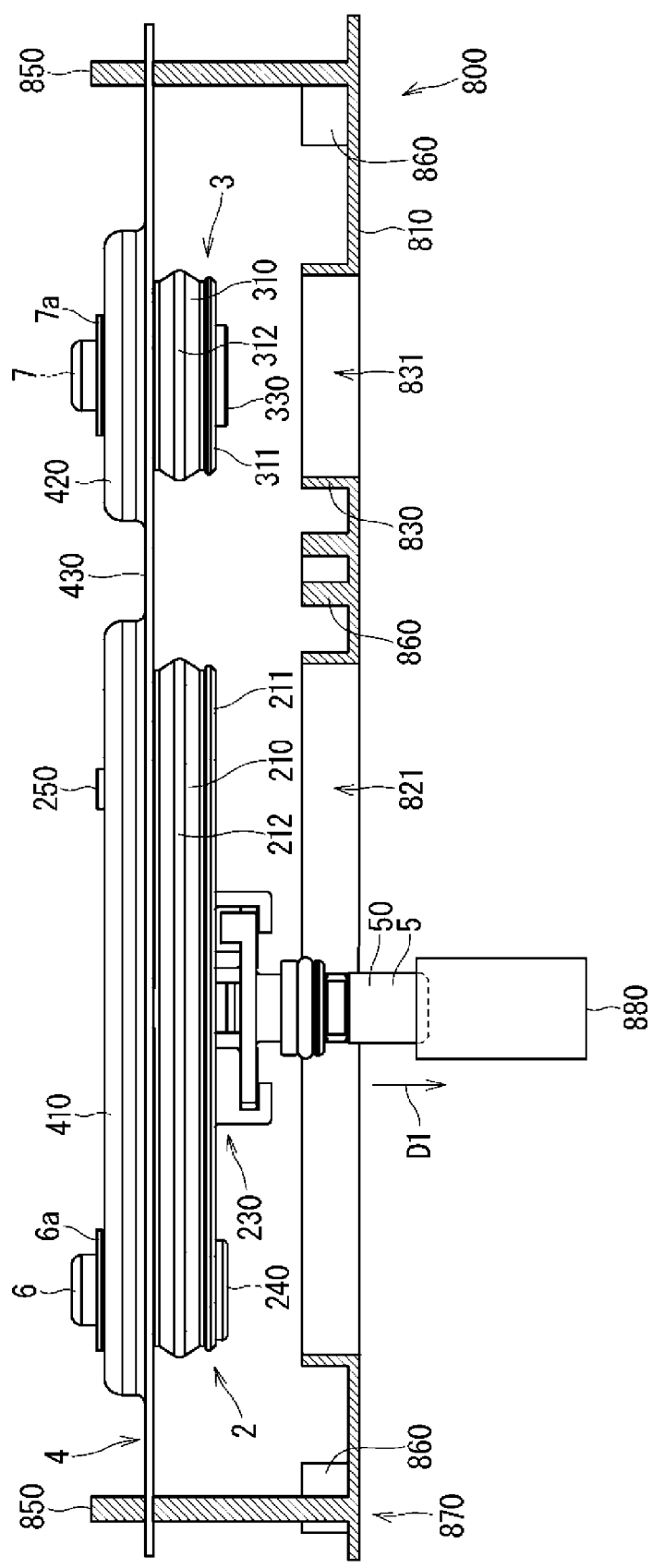
FIG. 11 is a schematic diagram showing an example of a state of being advanced further from FIG. 10 in the process of attaching the seal cover.
Figure 12:
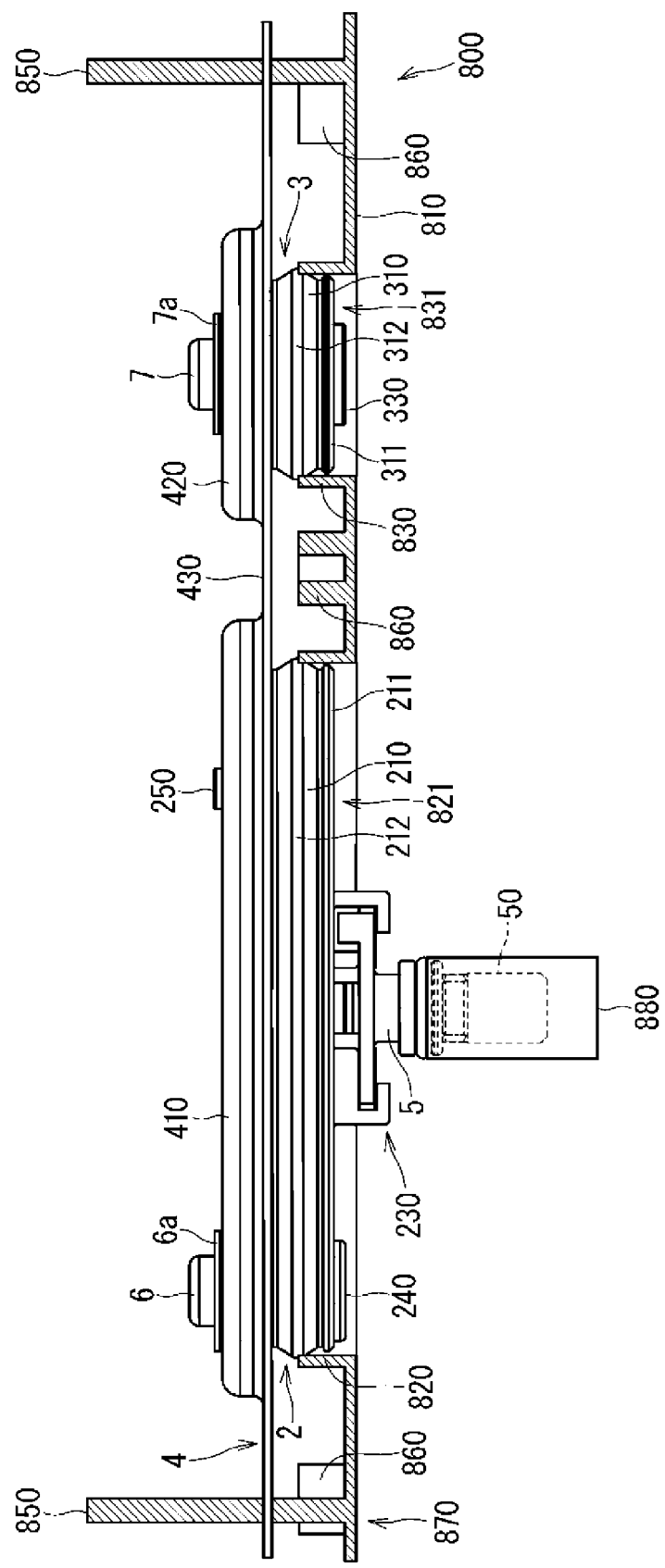
FIG. 12 is a schematic diagram showing an example of a state of being advanced further from FIG. 11 in the process of attaching the seal cover.
Figure 13:
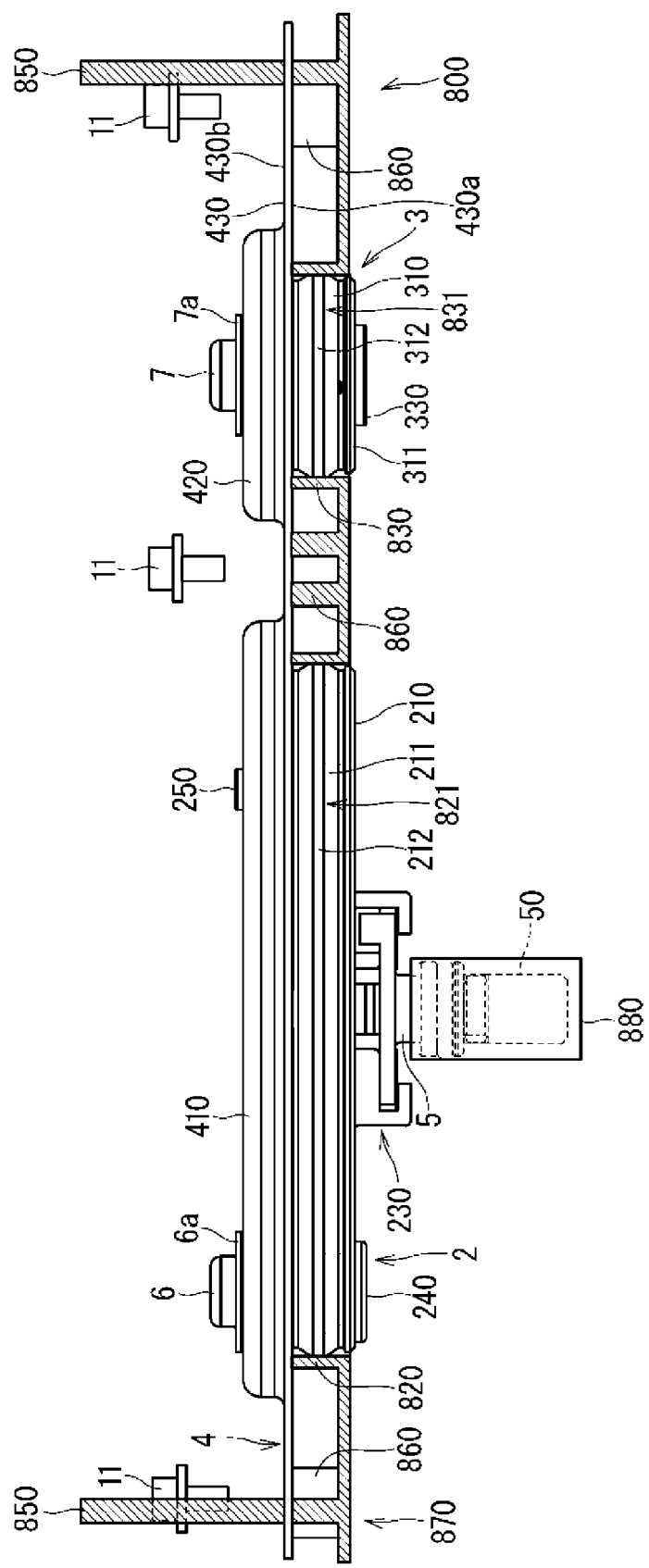
FIG. 13 is a schematic diagram showing an example of a state where the process of attaching the seal cover is completed.

FIGS. 10 to 13 are schematic diagrams showing an example of a process of attaching the seal cover 1 to the attachment target 800. FIGS. 10 to 13 show a cross-sectional structure of the attachment target 800 taken along the arrow A-A shown in FIG. 4. FIG. 11 is a schematic diagram showing an example of a state of being advanced further from FIG. 10 in the process of attaching the seal cover 1. FIG. 12 is a schematic diagram showing an example of a state of being advanced further from FIG. 11 in the process of attaching the seal cover 1. FIG. 13 is a schematic diagram showing an example of a state where the process of attaching the seal cover 1 is completed.

As shown in FIG. 10, in a state where the seal members 2 and 3 are oriented to the attachment target 800 side, the plurality of regulation pins 850 of the attachment portion 870 of the attachment target 800 are respectively inserted into the plurality of through holes 431 of the shield cover 4. By the regulation pins 850 being inserted into the through holes 431, the attachment position of the seal cover 1 in a direction that extends along the specific plane is regulated. It can be said that the regulation pins 850 are guide pins for guiding movement of the seal cover 1 to the attachment target 800.

When the seal cover 1 is brought close to the attachment target 800 in a state where the regulation pins 850 are inserted into the through holes 431, a leading end of the interlock connector 5 of the seal cover 1 starts to be mated with the partner connector 880 of the attachment target 800, as shown in FIG. 11. At this time, the connector 5 is movable relative to the seal member 2 along the specific plane, and thus an operator can easily mate the connector 5 with the connector 880. Furthermore, the seal member 2 to which the connector 5 is attached is movable relative to the shield cover 4 along the specific plane, and thus an operator can more easily mate the connector 5 with the connector 880.

In this example, the size of the seal member 2 in a direction that extends along the fitting direction D1 of the connector 5 (in FIG. 11, the size in the up-down direction) is set such that the seal portion 210 of the seal member 2 is not fitted into the opening portion 821 of the attachment target 800 in a state where the regulation pins 850 are inserted into the through holes 431 and the leading end of the connector 5 starts to be mated with the connector 880. In addition, the size of the seal member 3 in a direction that extends along the fitting direction D1 is set such that the seal portion 310 of the seal member 3 is not fitted into the opening portion 831 of the attachment target 800 in a state where the regulation pins 850 are inserted into the through holes 431, and the leading end of the connector 5 start to be mated with the connector 880.

When the seal cover 1 is brought closer to the attachment target 800, and the connector 5 is further mated with the connector 880, the seal portions 210 and 310 start to be fitted into the opening portions 821 and 832 of the attachment target 800, as shown in FIG. 12. At this time, the regulation pins 850 are inserted into the through holes 431 of the shield cover 4, and the connector 5 is partially mated with the connector 880, and thus the seal portions 210 and 310 start to be fitted into the opening portions 821 and 832 in a state where the positions of the connector 5 and the shield cover 4 in a direction that extends along the specific plane are regulated.

In this example, the connector 5 is movable relative to the seal member 2 along the specific plane, and the seal member 2 is movable relative to the shield cover 4 along the specific plane. Accordingly, the seal member 2 is movable along the specific plane independently from the connector 5 and the shield cover 4. Therefore, as shown in the example in FIG. 12, even when the seal portion 210 starts to be fitted into the opening portion 821 in a state where the positions of the connector 5 and the shield cover 4 in a direction that extends along the specific plane is regulated, the seal portion 210 can be easily fitted into the opening portion 821.

In addition, the seal member 3 is movable relative to the shield cover 4 along the specific plane, and thus an operator can easily fit the seal portion 310 of the seal member 3 into the opening portion 831.

When the seal cover 1 is brought closer to the attachment target 800, and the seal portions 210 and 310 are further fitted into the opening portions 821 and 831, the main surface 430a of the base portion 430 of the shield cover 4 hit the leading end surfaces of the bosses 860 of the attachment portion 870 of the attachment target 800 as shown in FIG. 13. Accordingly, movement of the seal cover 1 ends. In a state where the shield cover 4 hits the leading end surfaces of the bosses 860, the connector 5 is appropriately mated with the connector 880, and the seal portions 210 and 310 are appropriately fitted into the opening portions 821 and 831. That is to say, in a state where the shield cover 4 hits the leading end surfaces of the bosses 860, the opening portions 821 and 831 are appropriately sealed by the seal cover 1.

Thereafter, a plurality of fixing bolts 11 are respectively inserted into the plurality of through holes 432 provided in the shield cover 4, and are respectively screwed to the plurality of bosses 860 of the attachment target 800. Accordingly, the shield cover 4 is fixed to the attachment target 800, and attachment of the seal cover 1 to the attachment target 800 is completed.

Note that the seal portion 210 may start to be fitted into the opening portion 821 before the connector 5 starts to be mated with the connector 880. Also in this case, the seal member 2 is movable relative to the shield cover 4 along the specific plane, and thus the seal portion 210 can be easily fitted into the opening portion 821.

As described above, in this example, since the seal members 2 and 3 are attached to one shield cover 4, it is possible to seal the opening portions 821 and 831 of the attachment target 800 by attaching the one shield cover 4 to the attachment target 800. For this reason, ease of an operation of sealing the opening portions 821 and 831 of the attachment target 800 improves.

In addition, in this example, the screw 6 that passes through the shield cover 4 is attached at a position displaced from the center of the seal member 2 to one side in the alignment direction of the seal members 2 and 3. Accordingly, compared with a case where the screw 6 is attached at the center of the seal member 2, it is easy to recognize the orientation in which the seal member 2 is attached to the shield cover 4.

In a case where, for example, the seal member 2 is rotated by 180 degrees from the proper attachment orientation, the position of the through hole 411 of the shield cover 4 and the position of the boss 240 of the seal member 2 do not match. For this reason, the operator can easily recognize that the seal member 2 is in a state that is different from the state of the proper attachment orientation. Thus, ease of an operation of attaching the seal member 2 to the shield cover 4 improves. When the connector holding portion 230 is positioned at a central portion of the seal member 2 as in this example, it is difficult for the operator to specify whether or not the seal member 2 is in the proper attachment orientation by simply confirming the position of the connector holding portion 230. For this reason, when the connector holding portion 230 is positioned at a central portion of the seal member 2 as in this example, the screw 6 being attached at a position displaced from the center of the seal member 2 is effective.

In addition, in this example, the regulating protrusion portion 250 is positioned displaced from the center of the seal member 2 to the other side in the alignment direction of the seal members 2 and 3. Accordingly, the screw 6 and the regulating protrusion portion 250 are positioned on the opposite side to each other with the center of the seal member 2 therebetween.

Here, as described above, the seal member 2 can rotate along the specific plane using the screw 6 as a support point. For this reason, in a case where the seal member 2 does not include the regulating protrusion portion 250, there is the possibility that a movement amount of a portion of the seal member 2 that is on the other side to the screw 6 will be too large. Accordingly, there is the possibility that the seal portion 210 of the seal member 2 cannot be easily fitted into the opening portion 821 of the attachment target 800. In a case where, as in this example, the screw 6 and the regulating protrusion portion 250 are positioned on the opposite side to each other with the center of the seal member 2 therebetween, a movement amount of the portion of the seal member 2 that is on the other side to the screw 6 can be prevented from becoming too large. Thus, the seal portion 210 can be easily fitted into the opening portion 821, and ease of an operation of attaching the seal cover 1 to the attachment target 800 improves.

In addition, in this example, since the screw 7 is attached to the center of the circular seal member 3, the seal member 3 is unlikely to eccentrically rotate. Accordingly, the seal portion 310 of the seal member 3 can be easily fitted into the opening portion 831 of the attachment target 800. Thus, ease of an operation of attaching the seal cover 1 to the attachment target 800 improves.

In addition, in this example, the size of the seal member 2 in a direction that extends along in the fitting direction D1 is set such that, in a state where the regulation pins 850 are inserted into the through holes 431, and a leading end of the connector 5 starts to be mated with the connector 880, the seal portion 210 of the seal member 2 is not fitted into the opening portion 821 of the attachment target 800 (see FIG. 11). In this case, in a state where the positions of the connector 5 and the shield cover 4 in a direction that extends along the specific plane are regulated, the seal portion 210 starts to be fitted into the opening portion 821 (see FIG. 12). As described above, since the seal member 2 is movable relative to the connector 5 and the shield cover 4 along the specific plane, the seal portion 210 of the seal member 2 can be easily fitted into the opening portion 821 even when the positions of the connector 5 and the shield cover 4 in a direction that extends along the specific plane are regulated.

Note that the connector 5 does not need to be movable relative to the seal member 2. In addition, the position of the screw 6 and the position of the regulating protrusion portion 250 may be exchanged. That is to say, the screw 6 may be positioned on the seal member 3 side relative to the center of the seal member 2, and the regulating protrusion portion 250 may be positioned on the opposite side to the screw 6 relative to the center of the seal member 2.

In the above example, the boss 240 to which the screw 6 is attached is inserted into the through hole 411, but does not need to reach the through hole 411. That is to say, the boss 240 does not need to be present in the through hole 411. In this case, the space between the inner circumferential wall of the through hole 411 and the outer circumferential surface of the screw portion 6b of the screw 6 inserted into the through hole 411 forms the first clearance C1. That is to say, the screw 6 passes through the shield cover 4 in a state where there is the first clearance C1.

Similarly, the boss 330 to which the screw 7 is attached does not need to reach the through hole 421. That is to say, the boss 330 does not need to be present in the through hole 421. In this case, the space between the inner circumferential wall of the through hole 421 and the outer circumferential surface of the screw portion 7b of the screw 7 inserted into the through hole 421 forms the second clearance C2. That is to say, the screw 7 passes through the shield cover 4 in a state where there is the second clearance C2.

As described above, although a seal cover and an attachment target to which the seal cover is attached have been described in detail, the above description is illustrative in all aspects and the present disclosure is not limited thereto. In addition, the above various modified examples are applicable in combination provided that no contradiction arises. Moreover, it is understood that an infinite number of modified examples that are not illustrated can be envisioned without departing from the scope of the present disclosure.

LIST OF REFERENCE NUMERALS

1 Seal Cover
2 First seal member
3 Second seal member
4 Shield cover
5 Interlock connector
6 First screw
6a, 7a Washer
6b, 7b Screw portion
7 Second screw
10 Rotation stop protrusion portion
11 Fixing bolt
42 Rotation stop hole
50 Fitting portion
51 Held portion
51a Engagement hole
210 First seal portion
211, 311 Main body portion
211a, 311a Flat surface
211b, 311b Flat surface
212, 312 Seal ring
220, 320 Flange portion
230 Connector holding portion
231 Slide support portion
231a Guide groove
232 Farther-side receiving portion
233 Coming-off preventing structure
233a Engagement protrusion
240, 330, 860 Boss
241, 331 Leading end surface
242, 332 Lower hole
243, 333 Outer bottom surface
250 Regulating protrusion portion
260, 270, 340 Abutment rib
280, 281, 360 Thinned portion
310 Second seal portion
410 First placing recessed portion
411, 412, 415, 421, 431, 432 Through hole
413 Dish-shaped recessed portion
420 Second placing recessed portion
422 Rotation stop hole
430, 810 Base portion
430a, 430b, 810a, 810b Main surface
800 Attachment target
820 First tubular portion
821 First opening portion
830 Second tubular portion
831 Second opening portion
850 Regulation pin
870 Attachment portion
880 Partner connector
4130 Recessed surface
4150 Opening
C1 First clearance
C2 Second clearance
C3 Third clearance
D1 Fitting direction
D2 Slide movement direction

What is claimed is:

1. A seal cover that is to be attached to an attachment target including a first opening portion and a second opening portion that is aligned with the first opening portion and is smaller than the first opening portion, and covers the first opening portion and the second opening portion, the seal cover comprising:

a first seal member that includes a first seal portion that is fitted into the first opening portion to seal the first opening portion;
a second seal member that includes a second seal portion that is fitted into the second opening portion to seal the second opening portion, and is aligned with the first seal member;
a shield cover that is attached to the first seal member and the second seal member, is to be fixed to the attachment target, and includes a first through hole and a second through hole;
an interlock connector that is attached to the first seal member, and ensures attachment of the seal cover to the attachment target:
a first screw that is inserted into the first through hole of the shield cover and is attached to the first seal member; and
a second screw that is inserted into the second through hole of the shield cover and is attached to the second seal member;
wherein the first through hole has a first clearance therein,
the second through hole has a second clearance therein,
the attachment target includes a partner connector that is to be mated with the interlock connector,
the first seal member is movable relative to the shield cover along one plane in accordance with the first clearance, the one plane being a plane that intersects a fitting direction in which the interlock connector is mated with the partner connector,
the second seal member is movable relative to the shield cover along the one plane in accordance with the second clearance independently from the first seal member,
the interlock connector is attached at a position closer to a center of the first seal member than the first screw is in an alignment direction of the first seal member and the second seal member,
the first screw is attached at a position displaced from the center of the first seal member to one side in the alignment direction, and
the second screw is attached at a center of the second seal member.

2. The seal cover according to claim 1,
wherein the first seal member includes a protrusion portion that passes through the shield cover in a state where there is a third clearance, and regulates rotation of the first seal member, and
the protrusion portion is positioned displaced from the center of the first seal member to the other side in the alignment direction.

3. The seal cover according to claim 2,
wherein the protrusion portion protrudes from an opening provided in a recessed surface in a surface of the shield cover to the outside of the shield cover.

4. The seal cover according to claim 3,
wherein the opening surrounds a base side of the protrusion portion relative to a center in the protrusion direction of the protrusion portion.

5. The seal cover according to claim 1,
wherein an outer shape of the second seal member in planar view as viewed from a direction perpendicular to the one plane is circular, and
the seal cover includes a structure for stopping rotation of the second seal member.

6. The seal cover according to claim 1,
wherein the attachment target includes a regulation pin that regulates an attachment position of the seal cover in a direction that extends along the one plane, and protrudes in a direction opposite to the fitting direction,
the interlock connector is attached to the first seal member so as to be movable relative to the first seal member along the one plane,
the shield cover includes a third through hole into which the regulation pin is inserted, and
a size of the first seal member in a direction that extends along the fitting direction is set such that the first seal portion is not fitted into the first opening portion in a state where the regulation pin is inserted into the third through hole, and a leading end of the interlock connector starts to be mated with the partner connector.

* * * * *